United States Patent
Chakravadhanula et al.

(10) Patent No.: US 11,947,887 B1
(45) Date of Patent: Apr. 2, 2024

(54) TEST-POINT FLOP SHARING WITH IMPROVED TESTABILITY IN A CIRCUIT DESIGN

(71) Applicant: Cadence Design Systems, Inc., San Jose, CA (US)

(72) Inventors: Krishna Chakravadhanula, Vestal, NY (US); Brian Foutz, Charlottesville, VA (US); Prateek Kumar Rai, Uttar Pradesh (IN); Sarthak Singhal, Noida-Uttar Pradesh (IN); Christos Papameletis, Apex, NC (US); Vivek Chickermane, Slaterville Springs, NY (US)

(73) Assignee: Cadence Design Systems, Inc., San Jose, CA (US)

( * ) Notice: Subject to any disclaimer, the term of this patent is extended or adjusted under 35 U.S.C. 154(b) by 9 days.

(21) Appl. No.: 17/953,618

(22) Filed: Sep. 27, 2022

(51) Int. Cl.
*G06F 30/333* (2020.01)
*G06F 30/327* (2020.01)
*G01R 31/3185* (2006.01)

(52) U.S. Cl.
CPC .......... *G06F 30/333* (2020.01); *G06F 30/327* (2020.01); *G01R 31/318583* (2013.01)

(58) Field of Classification Search
CPC ........... G01R 31/318583; G06F 30/333; G06F 30/327
See application file for complete search history.

(56) References Cited

U.S. PATENT DOCUMENTS

| | | | | |
|---|---|---|---|---|
| 6,256,759 | B1 * | 7/2001 | Bhawmik | G01R 31/318591 714/726 |
| 11,714,129 | B2 * | 8/2023 | Chakrabarty | G06F 30/327 716/103 |
| 2003/0154432 | A1 * | 8/2003 | Scott | G01R 31/3185 714/724 |
| 2004/0177299 | A1 * | 9/2004 | Wang | G01R 31/31858 714/726 |

(Continued)

OTHER PUBLICATIONS

M. Nakao, S. Kobayashi, K. Hatayama, K. Iijima and S. Terada, "Low overhead test point insertion for scan-based BIST," International Test Conference 1999. Proceedings (IEEE Cat. No. 99CH37034), Atlantic City, NJ, USA, 1999, pp. 348-357.*

*Primary Examiner* — Steve N Nguyen
(74) *Attorney, Agent, or Firm* — Foley & Lardner LLP

(57) ABSTRACT

A system includes a memory that stores instructions and receives a circuit netlist, and includes a processing unit that accesses the memory and executes the instructions. The instructions include an EDA application that includes a test-point flop allocation module that is configured to evaluate the circuit netlist to determine compatibility of the test-point nodes in the circuit netlist. The test-point flop allocation module can further allocate each of the test-point flops to a test-point sharing group comprising a plurality of compatible test-point nodes. The EDA application also includes a circuit layout module configured to generate a circuit layout associated with the circuit design, the circuit layout comprising the functional logic and scan-chains comprising the test-point flops allocated to the test-point sharing groups in response to the circuit netlist. The circuit layout is employable to fabricate an integrated circuit (IC) chip.

20 Claims, 6 Drawing Sheets

(56) References Cited

U.S. PATENT DOCUMENTS

| | | | | |
|---|---|---|---|---|
| 2005/0235183 A1* | 10/2005 | Wang | ............. | G01R 31/318544 |
| | | | | 714/726 |
| 2005/0268190 A1* | 12/2005 | Kapur | ............ | G01R 31/318536 |
| | | | | 714/726 |
| 2007/0136700 A1* | 6/2007 | Wang | ...................... | G06F 30/30 |
| | | | | 716/112 |
| 2008/0195904 A1* | 8/2008 | Wang | ............. | G01R 31/318547 |
| | | | | 714/E11.159 |
| 2008/0256497 A1* | 10/2008 | Wohl | .................... | G06F 30/327 |
| | | | | 326/38 |
| 2010/0102825 A1* | 4/2010 | Bushnell | ........ | G01R 31/318583 |
| | | | | 29/874 |
| 2011/0022906 A1* | 1/2011 | Sasaki | ................... | G06F 30/327 |
| | | | | 714/724 |
| 2014/0101627 A1* | 4/2014 | Mochizuki | ............ | G06F 30/327 |
| | | | | 716/106 |

* cited by examiner

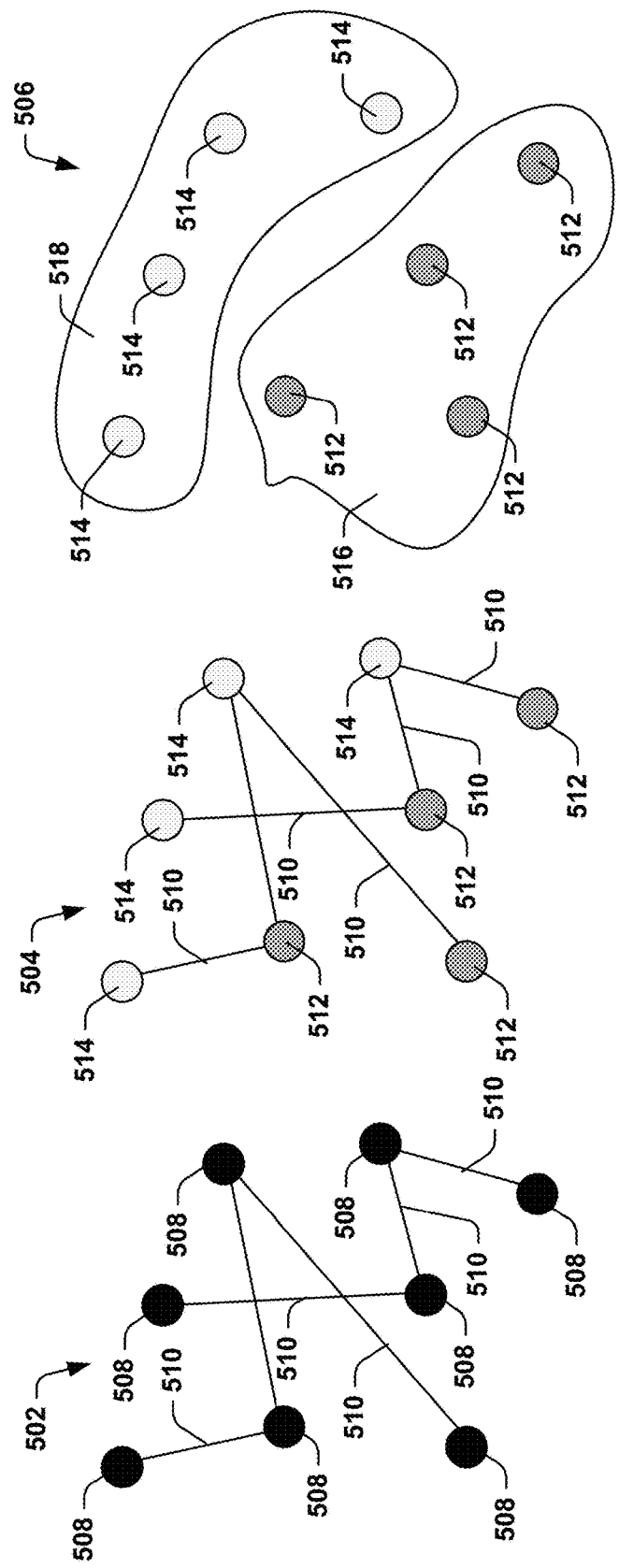

TEST-POINT FLOP SHARING WITH IMPROVED TESTABILITY IN A CIRCUIT DESIGN

TECHNICAL FIELD

The present description relates generally to circuit design systems, and specifically to test-point flop allocation in a circuit design.

BACKGROUND

Modern circuit designs often include dedicated testing circuitry to allow a fabricated circuit to be tested. Such dedicated testing circuitry can include scan-chains that allow multiple test-point nodes interconnecting functional logic to be monitored (e.g., via an observe test-point flop) or to be controlled (e.g., via a control test-point flop). The data on test-point nodes can thus be coupled via scan-chains that includes the test-point flops to allow a readout of the data at all of the test-point nodes or to read in data that is to be provided to the functional logic for testing. To provide for more efficient dedicated testing circuitry, the test-point nodes can be logically coupled, such that multiple test-point nodes can be shared with a single test-point flop. Therefore, the number of test-point flops can be reduced in a given circuit design. However, the selection of which test-point logic is shared can decrease their effectiveness when there is overlap of functional logic. For example, providing data to two or more test-point nodes via a single test-point flop can cause testability problems when there is overlapping functional logic coupled to the two or more test-point nodes.

SUMMARY

A system includes a memory that stores instructions and receives a circuit netlist, and includes a processing unit that accesses the memory and executes the instructions. The instructions include an EDA application that includes a test-point flop allocation module that is configured to evaluate the circuit netlist to determine compatibility of the test-point nodes in the circuit netlist. The test-point flop allocation module can further allocate each of the test-point flops to a test-point sharing group comprising a plurality of compatible test-point nodes. The EDA application also includes a circuit layout module configured to generate a circuit layout associated with the circuit design, the circuit layout comprising the functional logic and the scan-chains that include the test-point flops allocated to the test-point sharing groups in response to the circuit netlist. The circuit layout is employable to fabricate an integrated circuit (IC) chip.

Another example includes a non-transitory computer readable medium having machine-readable instructions. The machine-readable instructions are executed to receive, at a circuit design tool executing on a computing platform, a circuit netlist comprising functional logic, the test-point nodes interconnecting portions of the functional logic, and test-point flops associated with scan-chains. The machine readable instructions are also configured to evaluate the circuit netlist to determine compatibility of the test-point nodes in the circuit netlist via a test-point flop allocation module executing on the computing platform and to allocate each of the test-point flops to a test-point sharing group comprising a plurality of compatible test-point nodes via the test-point flop allocation module. The machine readable instructions are further configured to generate a circuit layout associated with the circuit design, the circuit layout comprising the functional logic and scan-chains comprising the test-point flops allocated to the test-point sharing groups in response to the circuit netlist via a circuit layout module executing on the computing platform, wherein the circuit layout is employable to fabricate an integrated circuit (IC) chip.

Another example includes a method for allocating test-point flops in scan-chains of a circuit design. The method includes receiving, at a circuit design tool executing on a computing platform, a circuit netlist comprising functional logic, the test-point nodes interconnecting portions of the functional logic, and the test-point flops. The method also includes generating a compatibility matrix based on the circuit netlist via a test-point flop allocation module executing on the computing platform, the compatibility matrix defining the compatibility of the test-point nodes in the circuit netlist based on shared nodes of the functional logic associated with a given pair of test-point nodes. The method also includes implementing a graph coloring algorithm based on the compatibility matrix to identify a quantity of compatible test-point nodes for each of the test-point nodes via the test-point flop allocation module. The graph coloring algorithm can be configured to order the test-point nodes from minimum to maximum compatible test-point nodes and to assign an identifier to each the test-point nodes in the order based on relative compatibility of the test-point nodes. The identifier can define a given one of a plurality of test-point sharing groups. The method also includes allocating each of the test-point flops to one of the test-point sharing groups via the test-point flop allocation module, each of the test-point sharing groups comprising a plurality of compatible test-point nodes. The method further includes generating a circuit layout associated with the circuit design, the circuit layout comprising the functional logic and scan-chains comprising the test-point flops allocated to the test-point sharing groups in response to the circuit netlist via a circuit layout module executing on the computing platform. The circuit layout is employable to fabricate an IC chip.

BRIEF DESCRIPTION OF THE DRAWINGS

FIG. 4 illustrates an example of a compatibility matrix.

FIG. 5 illustrates an example diagram of a graph coloring algorithm.

DETAILED DESCRIPTION

Figure 1:
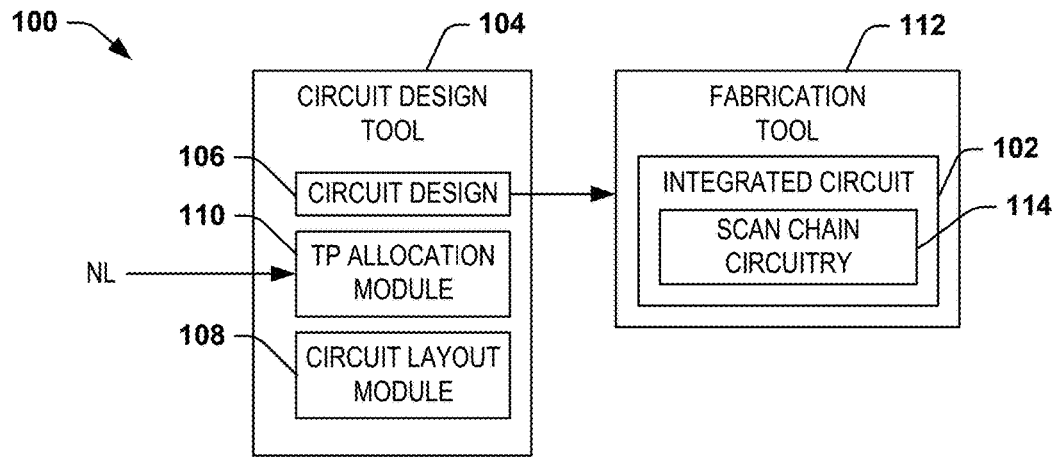
FIG. 1 illustrates an example diagram of design and fabrication of a circuit.

The present description relates generally to circuit design systems, and specifically to test-point flop allocation in a circuit design. As described herein, a test-point flop allocation module can provide for allocation of control test-point flops (hereinafter "test-point flops") of scan-chains based on compatibility of control test-point nodes (hereinafter "test-point nodes") in a circuit design. Thus, a given test-point flop can be associated with multiple test-point nodes of a given one test-point sharing group. The test-point flop allocation module can be implemented as one tool of a suite of tools in an electronic design automation (EDA) application, such as implemented in a circuit design tool. For example, a circuit design tool can include a processor and a memory that is configured to store the EDA applications. The processor can access the memory to facilitate generation of a circuit design in response to a circuit netlist (e.g., provided by a user) that is likewise stored in the memory.

As an example, the test-point flop allocation module can be implemented to determine compatibility of test-point nodes with respect to overlap of functional logic that fans out from two or more respective test-point nodes. As described herein, the term "compatibility" with respect to test-point nodes refers to the sharing of nodes in a fanout from each of two or more test-point nodes, and thus nodes in common between the fanouts of respective test-point nodes. As an example, the quantity of nodes can be compared to a threshold for determination of compatibility, such that if the quantity of nodes in common between the fanouts of respective test-point nodes is fewer than the threshold, then the test-point nodes can be considered compatible. As an example, the threshold can change during an initial determination of compatibility of the test-point nodes. For example, the initial threshold can be equal to zero, and can increase in response to a determination of a quantity of available test-point flops in the circuit design.

To determine the compatibility of the test-point nodes, the test-point flop allocation module can be configured to generate a compatibility matrix based on the circuit netlist. The compatibility matrix can define the compatibility of the test-point nodes in the circuit netlist based on identifying shared nodes of the functional logic associated with a given pair of test-point nodes. The test-point flop allocation module can thus implement a graph coloring algorithm based on the compatibility matrix to identify a quantity of compatible test-point nodes for each of the test-point nodes. As an example, the graph coloring algorithm can be configured to order the test-point nodes from minimum to maximum compatible test-point nodes and to assign an identifier (e.g., a color) to each the test-point nodes in the order based on relative compatibility of the test-point nodes. The identifier can thus define a given one of the test-point sharing groups.

As an example, the EDA applications can include a circuit layout module that is configured to generate a circuit layout corresponding to a physical layout of the circuit design. Therefore, the circuit layout module can provide a physical location of the test-point flops and the test-point nodes on the circuit layout. The test-point flop allocation module can thus subdivide the test-point sharing groups by relative physical proximity of the test-point nodes, such as to provide for a more efficient circuit layout and/or to satisfy equivalency in the quantities of the test-point flops relative to the test-point sharing groups. As an example, the circuit layout module can include a place-and-route tool to provide the physical layout and interconnects of the components of the circuit. Thus, the test-point flop allocation module can cooperate with the place and route tool to relocate the test-point flops based on the relative proximity of the test-point nodes. Accordingly, the test-point flop allocation module can provide for more efficient circuit design by allocating the test-point flops to the test-point sharing groups that are associated by test-point node compatibility, and by physically relocating the test-point flops to mitigate wiring congestion.

FIG. 1 illustrates an example diagram 100 of design and fabrication of a circuit. The diagram 100 includes functional blocks that can correspond to hardware, firmware, and/or software elements that are directed to the design and fabrication of an integrated circuit (IC) 102. The diagram 100 includes a circuit design tool 104 that is configured to facilitate generation of a circuit design 106 by a user, with the circuit design 106 corresponding to the fabricated IC 102. As an example, the circuit design tool 104 can include a suite of software tools in an electronic design automation (EDA) application. The circuit design tool 104 can be implemented on a computing system that includes a processor and a memory that is configured to store the EDA applications. The processor can access the memory to facilitate generation of the circuit design 106 in response to a circuit netlist. In the example of FIG. 1, the circuit netlist is demonstrated as an input "NL" to the circuit design tool 104.

The circuit design tool 104 includes a circuit layout module 108 and a test-point flop allocation module 110. The circuit layout module 108 can be configured as or can include a place-and-route tool that is configured to generate a circuit layout associated with the circuit design 106 based on the circuit netlist NL. The circuit layout can thus correspond to a physical layout of the components of the circuit design 106, such as including the interconnects of the components of the circuit of the circuit design 106. The circuit netlist NL can define the components to be included in the circuit design 106, including functional logic, test-point nodes that interconnect some of the functional logic, and test-point flops that are coupled to the test-point nodes and that are included to form scan-chains. Therefore, the circuit layout can include a physical location of each of the test-point nodes and the test-point flops.

Figure 2:
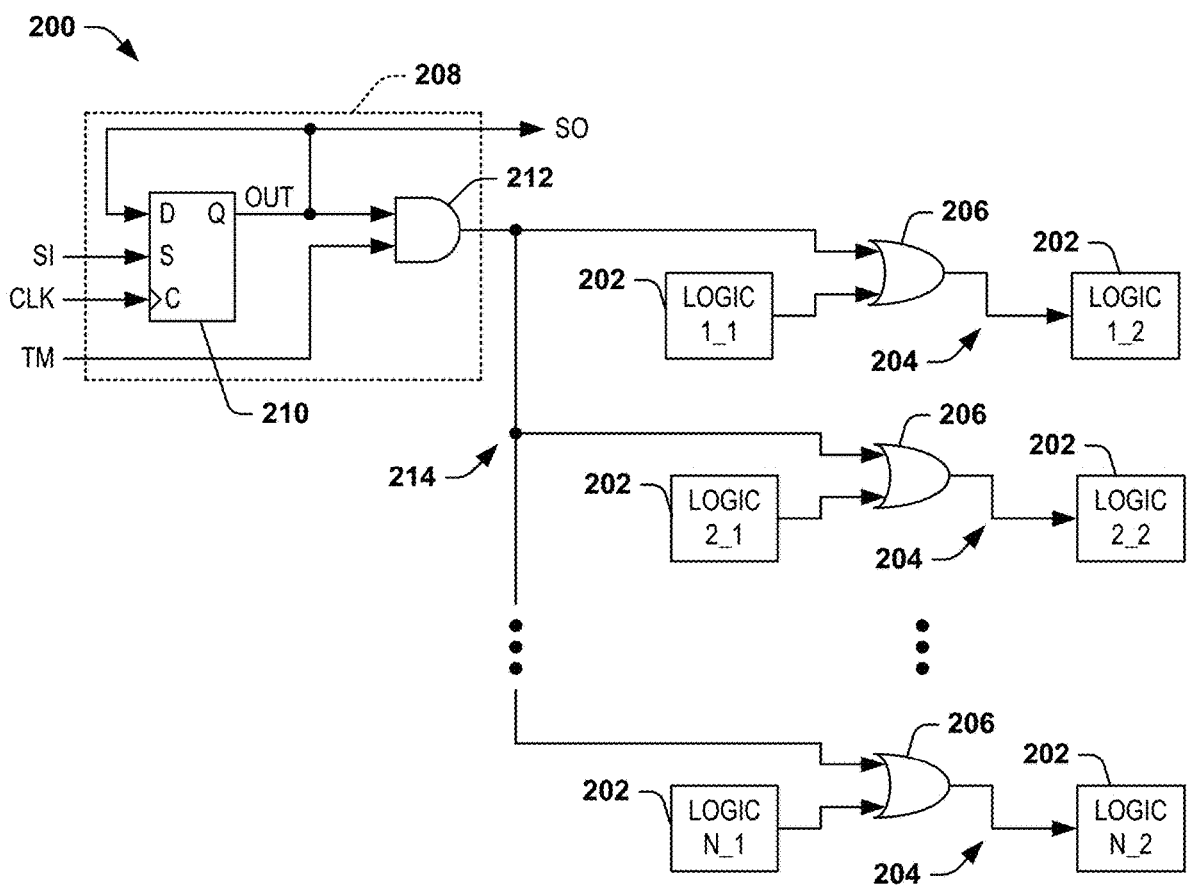
FIG. 2 illustrates an example diagram of test-point sharing for a test-point flop.

FIG. 2 illustrates an example diagram 200 of test-point sharing for a test-point flop. The diagram 200 illustrates a simplified example of the interconnection between functional logic, test-point nodes, and test-point flops, such as can be provided in the circuit design 106. Therefore, in the following description of the example of FIG. 2, reference is to be made to the example of FIG. 1.

The diagram 200 includes N pairs of blocks of functional logic 202, labeled as "LOGIC 1_1" and "LOGIC 1_2" for the first pair through "LOGIC N_1" and "LOGIC N_2" for the Nth pair. The blocks of functional logic 202 can collectively correspond to any of a variety of dedicated functionality of the IC 102 of FIG. 1. In the example of FIG. 2, there is a control one test-point node 204 provided at an output of an OR-gate 206 between each of the pairs of blocks of functional logic 202. As an example, the test-point nodes 204 can be predefined in the circuit netlist NL. As described herein, the test-point nodes 204 are demonstrated as control nodes that are intended to facilitate insertion of data (e.g., a logic-high) on the test-point nodes 204.

The diagram 200 includes a control flop logic block 208 that provides the data that is provided to the test-point nodes 204. The control flop logic block 208 includes a test-point flop 210 and an AND-gate 212. The test-point flop 210 can correspond to one test-point flop of a sequence of test-point flops in a scan-chain. The test-point flop 210 includes an output "Q" that provides an output signal "OUT", a data input "D" that receives the output signal OUT, a scan input "S" that receives a scan-in signal SI that corresponds to the data from the output of a preceding test-point flop in the scan-chain, and a clock input "C" that receives a clock signal CLK. In the example of FIG. 2, the output signal OUT is also provided as a signal "SO" to a next flop in the scan-chain. The test-point flop 210 can also include a selection input (not shown) that facilitates selection between the data input "D" and the scan input "S", and thus between scanning the data in for providing the test data and keeping the test-point nodes 204 fixed while performing a test procedure.

In the example of FIG. 2, the control flop logic block 208 is configured to provide a logic-high control signal to the test-point nodes 204. The AND-gate 212 includes a first input that receives the output signal OUT and a second input that receives a test mode signal "TM", and includes an output coupled to a node 214. The OR-gates 206 each have a first input coupled to the node 214 and a second input coupled to the first functional logic block 202 of the pair of functional logic blocks 202. Therefore, in response to the test mode signal TM being de-asserted (e.g., logic-low) during normal operation of the circuit, the AND-gate 212 provides a logic-low signal on the node 214. As a result, the first input of the OR-gates 206 is logic-low to allow data of either logic state to pass from the first functional logic block 202 to the second functional logic block 202 via the respective control node 204. However, in response to the test mode signal TM being asserted (e.g., logic-high) during a "test mode", the logic-high states of the output signal OUT and the test mode signal TM result in a logic-high signal on the node 214. Therefore, based on the logic-high signal at the first input of each of the OR-gates 206, each of the test-point nodes 204 receives a logic-high signal. Accordingly, in the example of FIG. 2, the control flop logic block 208 can insert a logic-high signal into each of the second blocks of functional logic 202 via the test-point nodes 204.

While the example of FIG. 2 demonstrates insertion of logic-high signals, the control flop logic block 208 could instead be configured to insert logic-low signals. For example, the AND-gate 212 could be replaced by a NAND-gate, and the OR-gates 206 could each be replaced by AND-gates to provide the test functionality of inserting logic-low signals into the functional logic blocks 202.

The example of FIG. 2 therefore demonstrates an efficient manner of sharing test-point nodes among a single test-point sharing group to be controlled by a single test-point flop. Therefore, by controlling the test-point nodes in a test-point sharing group via a single test-point flop, scan-chains of the circuit design can be much more efficient than providing test-point flops to test-point nodes on a 1:1 basis. However, such test-point sharing can be ineffective for incompatible test-point nodes. For example, the overall circuit design with respect to the functional logic can be complicated, and portions of functional logic that fan-out from a given test-point node can overlap with other portions of functional logic that fan-out from another test-point node. As a result, the overlapping of the portions of functional logic can result in incompatibility between the respective test-point nodes, which can render the test-point nodes less effective for being included in the same test-point sharing group that is controlled by a single test-point flop.

Figure 3:
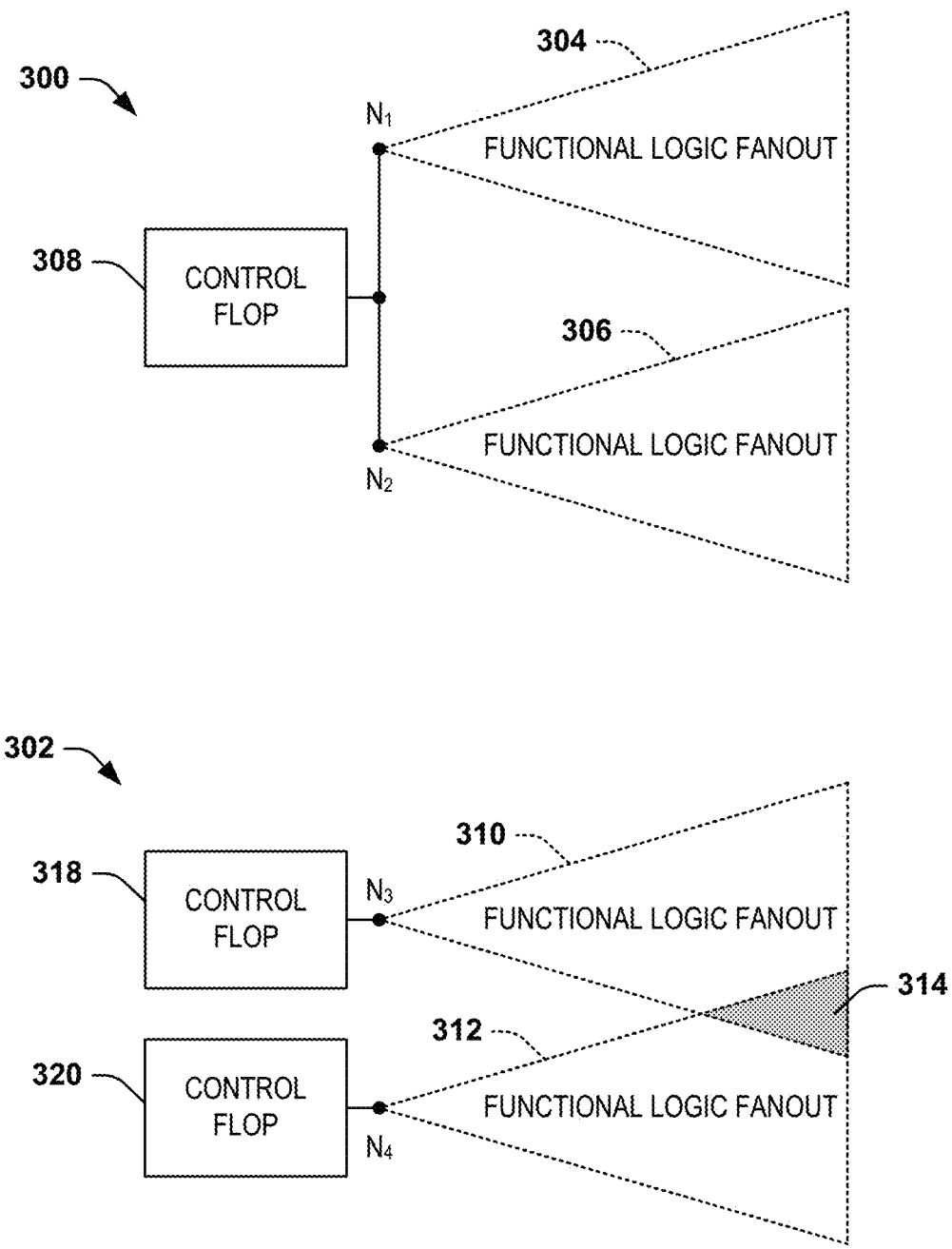
FIG. 3 illustrates an example diagram demonstrating test-point node compatibility.

FIG. 3 illustrates example diagrams demonstrating test-point node compatibility. The example of FIG. 3 includes a first diagram 300 and a second diagram 302. The first diagram 300 demonstrates a first test-point node "N1" having a respective functional logic fanout 304 and a second test-point node "N2" having a respective functional logic fanout 306. The functional logic fanouts 304 and 306 are equivalent to the functional logic blocks downstream of the test-point nodes 204 in the example of FIG. 2 (e.g., the functional logic blocks "LOGIC 1_2" through "LOGIC N_2"), and are thus provided respective inputs from the respective test-point nodes N1 and N2. Thus, the functional logic fanouts 304 and 306 include a sequence of logic gates and nodes that correspond to a portion of the functional logic in the circuit netlist NL. As an example, the functional logic fanouts 304 and 306 can include all input-to-output logic gate connections beginning with the respective test-point nodes N1 and N2 and ending with a flip-flop.

In the first diagram 300, the functional logic fanouts 304 and 306 are demonstrated as having no overlap, and thus do not have any nodes or logic-gates in common. Therefore, the first test-point node N1 and the second test-point node N2 can be considered compatible with respect to each other. As a result, the first and second test-point nodes N1 and N2 can be included in the same test-point sharing group, and therefore controlled by a single test-point flop 308. As described hereinafter, the test-point flop 308 and further references to "test-point flops" can also include associated logic of the control flop logic block 208 (e.g., the AND-gate 212). Accordingly, the single test-point flop 308 can provide control data to the test-point sharing group that includes the test-point nodes N1 and N2 during a test mode.

The second diagram 302 demonstrates a first test-point node "N3" having a respective functional logic fanout 310 and a second test-point node "N4" having a respective functional logic fanout 312. The functional logic fanouts 310 and 312 are equivalent to the functional logic blocks downstream of the test-point nodes 204 in the example of FIG. 2 (e.g., the functional logic blocks "LOGIC 1_2" through "LOGIC N_2"), and are thus provided respective inputs from the respective test-point nodes N3 and N4. Thus, similar to as described above, the functional logic fanouts 304 and 306 include a sequence of logic gates and nodes that correspond to a portion of the functional logic in the circuit netlist NL.

In the second diagram 302, the functional logic fanouts 310 and 312 have some overlap, demonstrated diagrammatically at 314. Therefore, the functional logic fanouts do have some nodes and/or logic-gates in common with each other. Therefore, the first test-point node N3 and the second test-point node N4 may be considered incompatible with respect to each other. For example, the number of nodes in common might be greater than a predefined threshold that defines compatibility. As an example, the predefined threshold can initially be zero, but can be increased as described in greater detail herein. Based on the incompatibility of the first and second test-point nodes N3 and N4, controlling the first and second test-point nodes N3 and N4 by a single test-point flop can result in the inability to fully test the functional logic fanouts 310 and 312. Therefore, in the second diagram 302, the functional logic fanout 310 is controlled by a first test-point flop 318 and the functional logic fanout 312 is controlled by a second test-point flop 320. Accordingly, the test-point flop 318 can provide control data to a test-point sharing group that includes the first test-point node N3 and the test-point flop 320 can provide control data to a separate test-point sharing group that includes the second test-point node N3 during a test mode.

Referring back to the example of FIG. 1, the test-point flop allocation module 110 can determine the compatibility of the test-point nodes based on the data in the circuit netlist NL (e.g., in the synthesis phase of designing the circuit design 106). As an example, the test-point flop allocation module 110 can be configured to generate a compatibility matrix based on the circuit netlist NL. The compatibility matrix can define the compatibility of the test-point nodes in the circuit netlist NL based on identifying shared nodes of the functional logic between a given pair of the test-point nodes. The test-point flop allocation module 110 can thus implement a graph coloring algorithm based on the compatibility matrix to identify a quantity of compatible test-point nodes for each of the test-point nodes. As an example, the graph coloring algorithm can be configured to order the test-point nodes from minimum to maximum compatible test-point nodes and to assign an identifier (e.g., a color) to each the test-point nodes in the order based on relative compatibility of the test-point nodes. The identifier can thus define a given one of the test-point sharing groups.

In the example of FIG. 1, the circuit design 106 that includes the circuit layout is provided to a fabrication tool 112 that is configured to fabricate the IC 102. The fabricated IC 102 can thus have a physical layout that corresponds to the circuit layout of the circuit design 106. In the example of FIG. 1, the IC 102 includes scan-chain circuitry 114 that includes the test-point flops allocated to the test-point sharing groups based on the compatibility of the test-point nodes, as described herein.

FIG. 4 illustrates an example of a compatibility matrix 400. The compatibility matrix 400 can be generated by the test-point flop allocation module 110 to determine compatibility between any two test-point nodes in the circuit netlist NL. In the example of FIG. 4, the compatibility matrix 400 can correspond to a circuit netlist that includes the test-point nodes N1, N2, N3, and N4 of the example of FIG. 3. Therefore, reference is to be made to the example of FIG. 3 in the following description of the example of FIG. 4.

The compatibility matrix 400 is demonstrated as including a separate row and a separate column for each of the test-point nodes N1, N2, N3, and N4, as well as any additional test-point nodes in the circuit netlist NL. For each row, the compatibility matrix 400 demonstrates a quantity of shared nodes of the functional logic fanout of the respective one of the test-point nodes N1, N2, N3, and N4 with the functional logic fanout of another of the test-point nodes N1, N2, N3, and N4 associated with each of the columns. As an example, the test-point flop allocation module 110 can evaluate the functional logic fanout of the two test-point nodes corresponding to an entry on the compatibility matrix 400 (intersection of row and column) in the circuit netlist NL to determine the presence of overlapping nodes. The test-point nodes N1, N2, N3, and N4 cannot be referenced with respective them themselves, and thus have a null data-set in the row/column of the same test-point node.

Therefore, the row of the test-point node N1 demonstrates that the test-point node N1 has zero shared nodes with each of the test-point nodes N2, N3, and N4. Therefore, the test-point node N1 can be considered compatible with each of the test-point nodes N2, N3, and N4. Similarly, the row of the test-point node N2 demonstrates that the test-point node N2 has zero shared nodes with each of the test-point nodes N1, N3, and N4. Therefore, the test-point node N2 can be considered compatible with each of the test-point nodes N1, N3, and N4. However, the row of the test-point node N3 demonstrates that the test-point node N3 has zero shared nodes with each of the test-point nodes N1 and N2, but has (by example) fifty shared nodes with the test-point node N4. Likewise, the row of the test-point node N4 demonstrates that the test-point node N4 has zero shared nodes with each of the test-point nodes N1 and N2, but has (by example) fifty shared nodes with the test-point node N3. Therefore, the test-point nodes N3 and N4 are each compatible with the test-point nodes N1 and N2, but are incompatible with each other, as described above in the example of FIG. 3.

The compatibility matrix 400 can thus, in each entry of row/column intersection, demonstrate whether a pair of test-point nodes are compatible. As described above, in response to the test-point flop allocation module 110 generating the compatibility matrix 400, the test-point flop allocation module 110 can implement a graph coloring algorithm to determine a quantity of compatible test-point nodes for each of the test-point nodes. As an example, the graph coloring algorithm can correspond to any of a variety of graph algorithms (e.g., the Welch-Powell algorithm) to determine a relative compatibility of each of the test-point nodes to the other test-point nodes based on the compatibility matrix 400.

FIG. 5 illustrates an example diagram 500 of a graph coloring algorithm of the test-point flop allocation module 110. The diagram 500 is demonstrated graphically for ease in demonstration of the virtual machinations of the graph coloring algorithm. However, the test-point flop allocation module 110 can be configured to implement the graph coloring algorithm in software to coincide with the graphical demonstration of the diagram 500. While reference is to be made to the compatibility matrix, the example diagram 500 is unrelated to the specific parameters (e.g., the test-point nodes N1, N2, N3, and N4 and the respective functional logic fanout overlap thereof) of the compatibility matrix 400 in the example of FIG. 4.

The diagram 500 includes a first portion 502, a second portion 504, and a third portion 506. The first portion 502 demonstrates a set of eight test-point nodes 508 that are graphically arranged in two-dimensional space. As described above, the diagram 500 is illustrated in a graphical example, so the location of the test-point nodes 508 is arbitrary for purposes of the graph coloring algorithm in the first portion 502. As an example, the test-point flop allocation module 110 can evaluate the compatibility matrix to determine incompatibility of each test-point node 508 with the other test-point nodes 508. The first portion 502 includes a line 510 interconnecting incompatible test-point nodes 508. The diagram 500 is demonstrated as a simplistic manner, such that the diagram 500 demonstrates only eight test-point nodes 508 and no more than two lines 510 denoting incompatible test-point nodes 508 between them. However, the graph coloring algorithm can evaluate significantly more test-point nodes (e.g., thousands) and many more incompatibility lines between them.

As described herein, the graph coloring algorithm can provide an identifier to each of the test-point nodes 508 based on respective compatibility. The identifier (e.g., a color) can thus identify groups of compatible test-point nodes 508. In the second portion 504, the graph coloring algorithm can provide a first identifier (dark gray) to a first set of the test-point nodes 512 and a second identifier (light gray) to a second set of the test-point nodes 514. In the second portion 504, none of the test-point nodes 512 are connected by a line 510 to any of the other test-point nodes 512. Similarly, none of the test-point nodes 514 are connected by a line 510 to any of the other test-point nodes 514. Given that the lines 510 denote incompatibility, the test-point nodes 512 are therefore all compatible with each other, and the test-point nodes 514 are likewise all compatible with each other.

In the third portion 506, the test-point nodes 512 are grouped together to form a first test-point sharing group 516 and the test-point nodes 514 are grouped together to form a second test-point sharing group 518. Accordingly, a single test-point flop can be allocated to the first test-point sharing group 516 to provide control data to each of the test-point nodes 512 in a testing mode, similar to the test-point node 308 in the example of FIG. 3. Similarly, a single test-point flop can be allocated to the second test-point sharing group 518 to provide control data to each of the test-point nodes 514 in a testing mode, similar to the test-point node 308 in the example of FIG. 3.

To implement the graph coloring algorithm to provide the identifiers to the test-point nodes, the test-point flop allocation module 110 can evaluate the compatibility matrix to determine the total number of compatible test-point nodes that each test-point node has. In other words, the graph coloring algorithm can determine a quantity of compatible test-point nodes for each of the test-point nodes. The graph coloring algorithm can then order each of the test-point nodes from minimum to maximum compatible test-point nodes.

Starting at the first test-point node in the listed order, and thus the test-point node with the least compatible test-point nodes, the graph coloring algorithm can assign an identifier (e.g., color) to each the test-point nodes in the order based on relative compatibility of the test-point nodes. As the graph coloring algorithm indexes to the next test-point node in the order, the graph coloring algorithm can determine if the test-point node is compatible with any of the test-point nodes that have already been assigned an identifier. If the test-point node is compatible with a test-point node that has already been assigned an identifier, the graph coloring algorithm can assign the same identifier to the test-point node as the previously assigned compatible test-point node. The graph coloring algorithm can thus provide an identifier to all of the test-point nodes in the ordered list. By starting with the test-point node having the minimum quantity of compatible other test-point nodes, the graph coloring algorithm can more easily assign subsequent identifiers to the test-point nodes having the largest number of compatible test-point nodes. Upon completion of the graph coloring algorithm, the test-point flop allocation module 110 can thus designate each identifier to a test-point sharing group, and can thus allocate a test-point flop to each of the test-point sharing groups.

When assigning an identifier to a test-point node farther down the ordered list, in response to determining that there are multiple test-point nodes that are compatible with the test-point node but which have different identifiers, the graph coloring algorithm can select one of the different previously assigned identifiers to the test-point node based on a variety of factors. As a first example, the graph coloring algorithm can select a previous identifier based on an expectation of proximity of the test-point nodes, such that the graph coloring algorithm can assign the same identifier to the test-point node as other test-point nodes that are estimated to be proximal to the test-point node on the circuit layout based on the circuit netlist NL. As a second example, the graph coloring algorithm can select a previous identifier based on a quantity of test-point nodes having the same identifier, such that the graph coloring algorithm can assign the same identifier as the largest set of test-point nodes having the same identifier. A variety of other factors can be determinative for selection of one of the different previously assigned identifiers to the test-point node.

As an example, the graph coloring algorithm can determine that the number of identifiers assigned by the graph coloring algorithm can exceed the number of test-point flops defined by the circuit netlist NL. As described above, the determination of compatibility between two test-point nodes can be based on a quantity of shared nodes relative to a predefined threshold. Initially, as an example, the predefined threshold can be zero, such that any shared nodes can result in a finding of incompatibility between two test-point nodes. However, if the graph coloring algorithm determines that the number of identifiers assigned by the graph coloring algorithm exceeds the number of test-point flops defined by the circuit netlist NL, the test-point flop allocation module 110 can increase the predefined threshold by a predetermined quantity and can implement the graph coloring algorithm again to determine if the quantity of identifiers is less than or equal to the number of test-point flops in the circuit netlist NL. The test-point flop allocation module 110 can iteratively increase the predefined threshold, if necessary, until the quantity of identifiers is less than or equal to the number of test-point flops in the circuit netlist NL.

As another example, after implementing the graph coloring algorithm, the test-point flop allocation module 110 can determine that there are more test-point flops defined in the circuit netlist NL than there are identifiers corresponding to respective test-point sharing groups. As a result, the test-point flop allocation module 110 can be configured to subdivide at least one of the test-point sharing groups into smaller test-point sharing groups.

As a first example, the test-point flop allocation module 110 can subdivide the test-point sharing groups in the circuit synthesis phase of designing the circuit design 106, such that the test-point flop allocation module 110 can anticipate expected proximal groups of the test-point nodes of a given one of the test-point sharing groups based on the circuit netlist NL (e.g., based on functional tiers defined in the circuit netlist NL). Thus, the test-point flop allocation module 110 can subdivide the test-point sharing groups into two or more smaller test-point sharing groups having approximately proximal test-point nodes in response to the quantity of test-point flops defined by the circuit netlist being greater than the quantity of test-point sharing groups.

Figure 6:
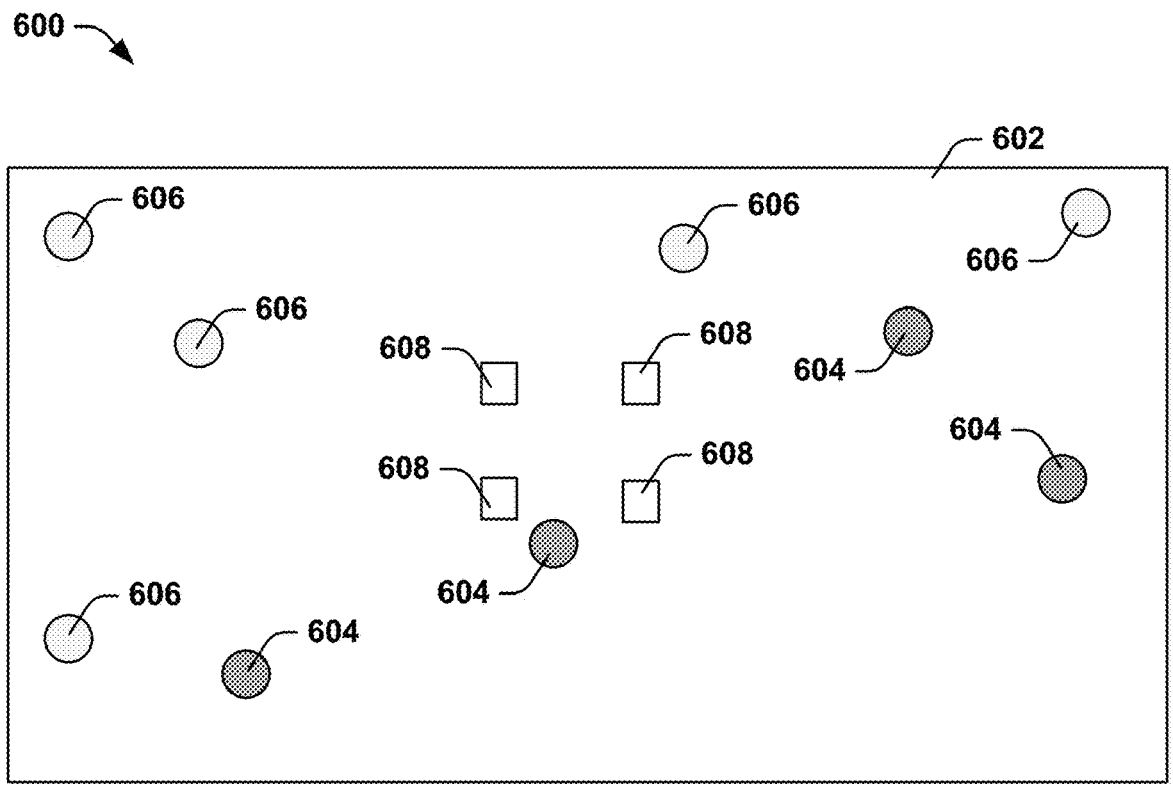
FIG. 6 illustrates an example diagram of a circuit layout.
Figure 7:
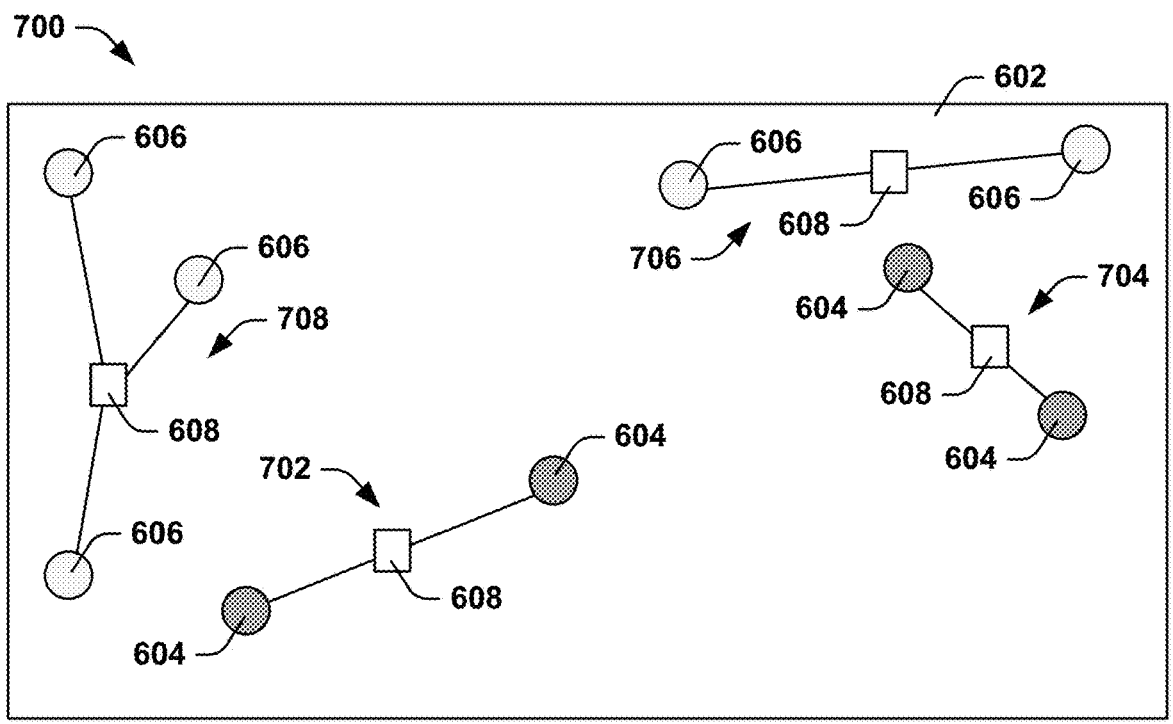
FIG. 7 illustrates another example diagram of a circuit layout.

As a second example, the test-point flop allocation module 110 can cooperate with the circuit layout module 108 to subdivide the test-point sharing groups, as demonstrated in the examples of FIGS. 6 and 7. FIG. 6 illustrates an example diagram of a circuit layout 600. The circuit layout 600 can correspond to a circuit layout of the circuit design 106, as generated by the circuit layout module 108 of the circuit design tool 104. The circuit layout 600 is demonstrated as a two-dimensional area 602 representing a semiconductor die that includes a physical location of test-point nodes and test-point flops.

In the example of FIG. 6, the test-point nodes can correspond to the test-point nodes depicted graphically in the graph coloring algorithm in the example of FIG. 5. Therefore, the test-point nodes are demonstrated as a first set of compatible test-point nodes 604 and a second set of compatible test-point nodes 606. Therefore, the first set of compatible test-point nodes 604 can initially form a first test-point sharing group and the second set of compatible test-point nodes 606 can initially form a second test-point sharing group, as generated by the graph coloring algorithm. The test-point nodes 604 can thus correspond to the test-point nodes 512 in the first test-point sharing group 516, and the test-point nodes 606 can correspond to the test-point nodes 514 in the second test-point sharing group 518 in the example of FIG. 5. The circuit layout 600 also includes four test-point flops 608. In the examples of FIGS. 6 and 7, the remaining circuit components (e.g., the functional logic) are not shown for the sake of simplicity. Similarly, as described above in the example of FIG. 5, the examples of FIGS. 6 and 7 are demonstrated simplistically, such that the circuit layout 600 can include significantly more test-point nodes (e.g., tens of thousands) and test-point flops (e.g., thousands), depending on the size of the circuit.

As described above, the test-point nodes 604 and 606 and the test-point flops 608 can be included in the circuit netlist NL. Thus, the designer of the circuit design 106 can be agnostic as to the resulting physical locations of the test-point nodes 604 and the test-point flops 608 at the time of creating the circuit netlist NL. The circuit layout module 108 thus generates the circuit layout from the circuit netlist NL in which the physical layout of the test-point nodes 604 and the test-point flops 608 are allocated by the circuit layout module 108 based on any of a variety of predefined protocols of the circuit layout module 108 (e.g., functional tiers).

In the following examples of FIGS. 6 and 7, the circuit netlist NL defines four test-point flops 608, but the graph coloring algorithm has designated only two separate identifiers, and thus the two test-point sharing groups that include the test-point nodes 604 and 606, respectively. Therefore, as described above, the test-point flop allocation module 110 can cooperate with the circuit layout module 108 to subdivide the test-point sharing groups into smaller test-point sharing groups. In the examples of FIGS. 6 and 7, the test-point flop allocation module 110 can identify proximity of the test-point nodes 604 relative to each other and of the test-point nodes 606 relative to each other. As an example, the test-point flop allocation module 110 can implement any of a variety of physical layout determination algorithms on the circuit layout 600 to determine the relative proximity of the test-point nodes 604 relative to each other and of the test-point nodes 606 relative to each other. The test-point flop allocation module 110 can thus subdivide the test-point sharing groups into smaller test-point sharing groups of proximally arranged test-point nodes.

FIG. 7 illustrates an example diagram 700 of subdivision of test-point sharing groups. The diagram 700 includes the circuit layout 600, the test-point nodes 604 and 606, and the test-point flops 608. The diagram 700 demonstrates that the test-point nodes 604 and 606 are provided in the same physical location as provided by the circuit layout module 108 in the circuit layout 600. However, the circuit layout 600 demonstrates the test-point flops 608 having been relocated by the test-point flop allocation module 110 based on the subdivision of the test-point nodes 604 and 606 in the test-point sharing groups. The circuit layout 600 thus demonstrates a first test-point sharing group 702 and a second test-point sharing group 704 that have been subdivided from the initial test-point sharing group formed by the compatible test-point nodes 604. Similarly, the circuit layout 600 demonstrates a third test-point sharing group 706 and a fourth test-point sharing group 708 that have been subdivided from the initial test-point sharing group formed by the compatible test-point nodes 606. Therefore, the subdivision of the test-point sharing groups provides an equal number of test-point sharing groups and test-point flops 608. The subdivision of the test-point sharing groups can be based, for example, on size of the test-point sharing groups and/or proximity of the test-point nodes 604 and 606. In other examples, not all test-point sharing groups may be subdivided, such that the test-point flop allocation module 110 can determine whether to subdivide a test-point sharing group based on quantity of test-point nodes, relative proximity of test-point nodes, and/or a variety of other factors.

The circuit layout 600 includes the test-point flops 608 having been relocated proximal to the respective test-point sharing groups 702, 704, 706, and 708. As an example, upon subdividing the test-point nodes 604 and 606 to the respective test-point sharing groups 702, 704, 706, and 708, the test-point flop allocation module 110 can determine an approximate centroid location of each of the test-point sharing groups 702, 704, 706, and 708 in two-dimensional space. The test-point flop allocation module 110 can thus relocate a given one of the test-point flops 608 to the approximate centroid location for each of the test-point sharing groups 702, 704, 706, and 708. As an example, the test-point flop allocation module 110 can determine which of the test-point flops 608 in the circuit layout 600 is most proximal to each of the approximate centroid locations of the test-point sharing groups 702, 704, 706, and 708, and can relocate the respective most proximal test-point flops 608 to the approximate centroid locations of the respective test-point sharing groups 702, 704, 706, and 708.

Upon relocating the test-point flops 608, the circuit layout module 108 can adjust the locations of each of the test-point flops 608 and surrounding functional logic to fit the relocated test-point flops 608. For example, while the functional logic is not demonstrated in the examples of FIGS. 6 and 7, the circuit layout 600 is filled with the functional logic, as provided by the circuit layout module 108 from the circuit netlist NL. Therefore, when the test-point flops 608 are relocated, it is very highly likely that the relocated position of the test-point flops 608 would overlap existing functional logic. Accordingly, the circuit layout module 108 (e.g., an associated place-and-route tool) can provide minor adjustments to the locations of the functional logic and/or the test-point flops 608 to facilitate the relocation of the test-point flops 608 to the approximate centroid locations of the test-point sharing groups 702, 704, 706, and 708. Similarly, the OR-gates or AND-gates (not shown) associated with the test-point nodes 604 and 606 can likewise be relocated and adjusted by the circuit layout module 108.

Upon relocating and adjusting the test-point flops 608 and associated logic (e.g., the AND/OR-gates), the circuit layout module 108 can then provide the wiring interconnect between all of the test-point flops 608 to form the associated scan-chain. The circuit layout 600 thus demonstrates the wiring interconnects between the respective test-point nodes 604 and 606 and the test-point flops 608 in an efficient manner that mitigates wiring congestion. The circuit layout 600 can thus be exported for fabrication of the associated IC 102. Accordingly, the IC 102 fabricated to have the circuit layout 600 can have an effective allocation of test-point flops to test-point nodes for control testing in a manner that mitigates errors resulting from functional logic fanout overlap.

Figure 8:
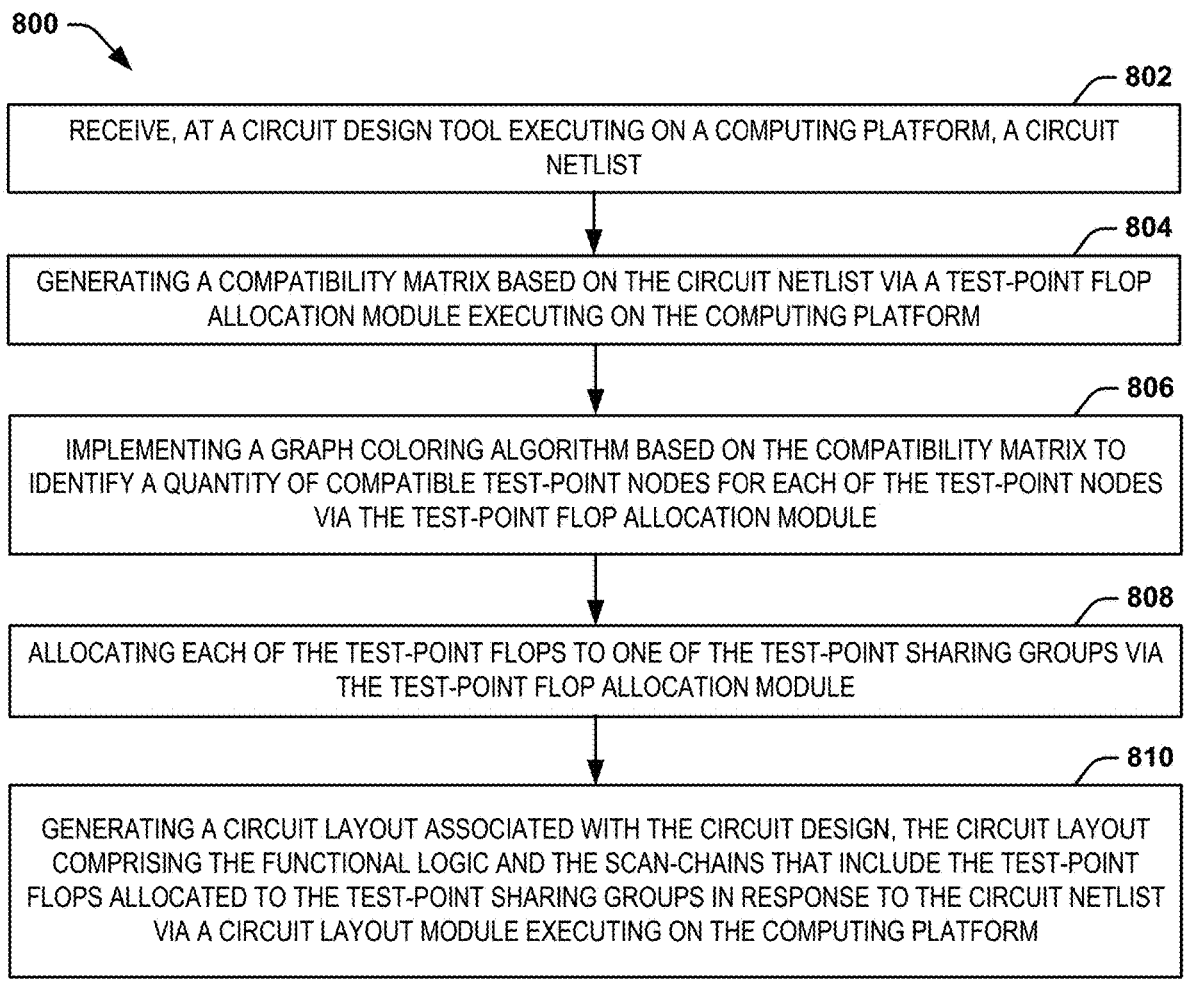
FIG. 8 illustrates an example of a method for allocating test-point flops of scan-chains in a circuit design.

In view of the foregoing structural and functional features described above, an example method will be better appreciated with reference to FIG. 8. While, for purposes of simplicity of explanation, the method is shown and described as executing serially, it is to be understood and appreciated that the method is not limited by the illustrated order, as parts of the method could occur in different orders and/or concurrently from that shown and described herein. Such method can be executed by various components configured in an integrated circuit, processor, or a controller, for example.

FIG. 8 illustrates an example of a method for allocating test-point flops (e.g., the test-point flops 608) in scan-chains of a circuit design (e.g., the circuit design 106). At 802, at a circuit design tool (e.g., the circuit design tool 104) executing on a computing platform, a circuit netlist (e.g., the circuit netlist NL) is received. The circuit netlist includes functional logic (e.g., the functional logic 202), the test-point nodes interconnecting portions of the functional logic, and the test-point flops. At 804, a compatibility matrix (e.g., the compatibility matrix 400) is generated based on the circuit netlist via a test-point flop allocation module (e.g., the test-point flop allocation module 110) executing on the computing platform. The compatibility matrix can define the compatibility of the test-point nodes in the circuit netlist based on shared nodes of the functional logic associated with a given pair of test-point nodes.

At 806, a graph coloring algorithm is implemented based on the compatibility matrix to identify a quantity of compatible test-point nodes for each of the test-point nodes via the test-point flop allocation module. The graph coloring algorithm can be configured to order the test-point nodes from minimum to maximum compatible test-point nodes and to assign an identifier (e.g., color) to each the test-point nodes in the order based on relative compatibility of the test-point nodes. The identifier can define a given one of a plurality of test-point sharing groups (e.g., the test-point sharing groups 516 and 518). At 808, each of the test-point flops is allocated to one of the test-point sharing groups via the test-point flop allocation module. Each of the test-point sharing groups comprising a plurality of compatible test-point nodes (e.g., the respective compatible test-point nodes 512 and 514). At 810, a circuit layout (e.g., the circuit layout 600) associated with the circuit design is generated, the circuit layout including the functional logic and scan-chains that include the test-point flops allocated to the test-point sharing groups in response to the circuit netlist via a circuit layout module (e.g., the circuit layout module 108) executing on the computing platform. The circuit layout is employable to fabricate an integrated circuit (IC) chip.

Figure 9:
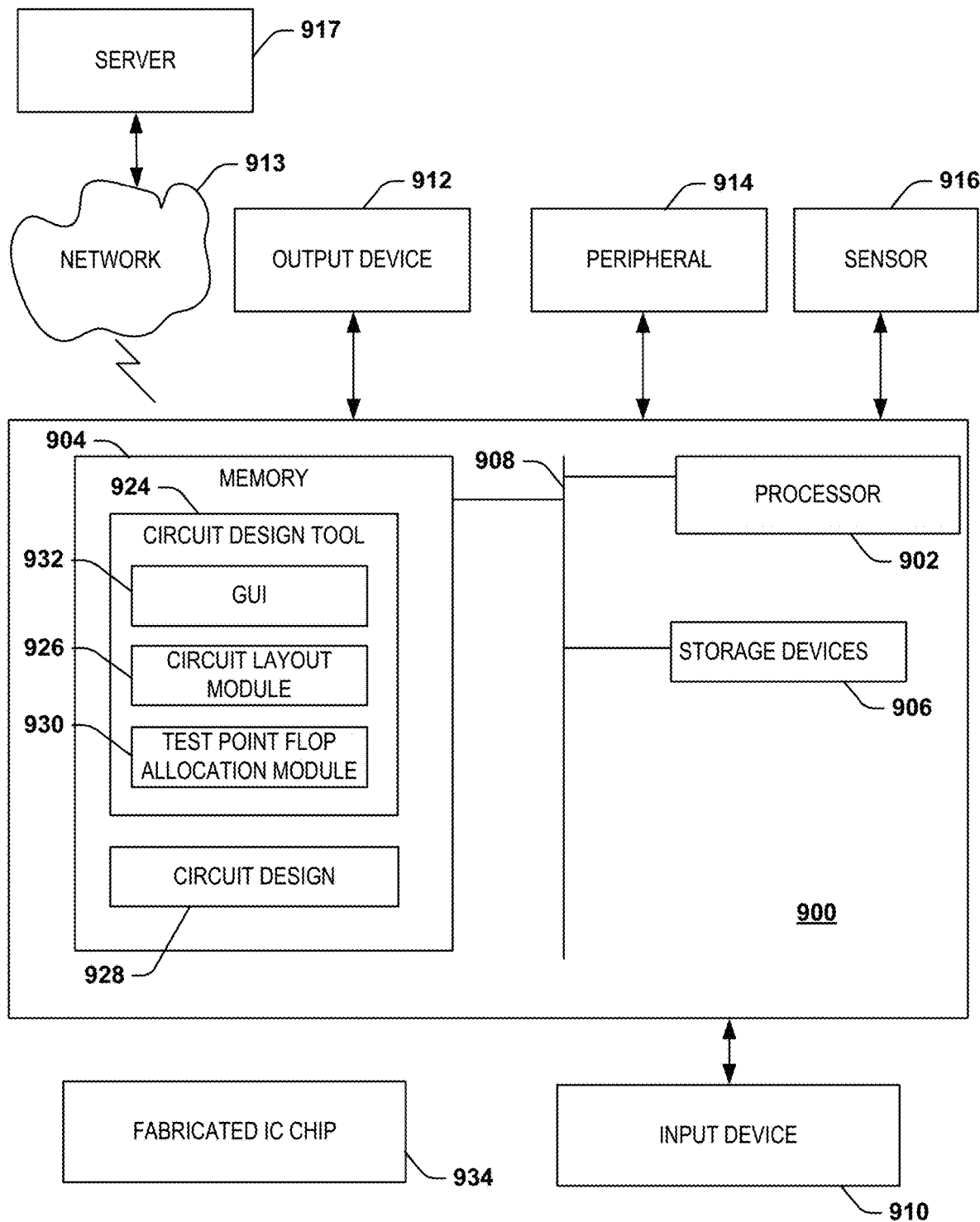
FIG. 9 illustrates an example of a computing system employable to execute a test-point flop allocation module.

The examples herein may be implemented on virtually any type of computing system regardless of the platform being used. For example, the computing system may be one or more mobile devices (e.g., laptop computer, smart phone, personal digital assistant, tablet computer, or other mobile device), desktop computers, servers, blades in a server chassis, or any other type of computing device or devices that includes at least the minimum processing power, memory and input and output device(s) to perform one or more embodiments. FIG. 9 illustrates an example of a computing system 900 employable to execute a test-point flop allocation module.

As shown in FIG. 9, the computing system 900 can include a computer processor 902, associated memory 904 (e.g., RAM), cache memory, flash memory, etc.), one or more storage devices 906 (e.g., a solid state drive, a hard disk drive, an optical drive such as a compact disk (CD) drive or digital versatile disk (DVD) drive, a flash memory stick, etc.) and numerous other elements and functionalities. The computer processor 902 may be an IC chip for processing instructions. For example, the computer processor may be one or more cores, or micro-cores of a processor. Components of the computing system 900 can communicate over a data bus 908.

The computing system 900 may also include an input device 910, such as any combination of one or more of a touchscreen, keyboard, mouse, microphone, touchpad, electronic pen, or any other input device. Further, the computing system 900 can include an output device 912, such as one or more of a screen (e.g., light emitting diode (LED) display, an organic light emitting diode (OLED) display, a liquid crystal display (LCD), a plasma display, touchscreen, cathode ray tube (CRT) monitor, projector, or other display device), a printer, external storage, or any other output device. In some examples, such as a touch screen, the output device 912 can be the same physical device as the input device 910. In other examples, the output device 912 and the input device 910 can be implemented as separate physical devices. The computing system 900 can be connected to a network 913 (e.g., a LAN, a wide area network (WAN) such as the Internet, a mobile network, or any other type of network) via a network interface connection (not shown). The input device 910 and output device(s) 912 can be connected locally and/or remotely (e.g., via the network 913) to the computer processor 902, the memory 904 and/or the storage devices 906. Many different types of computing systems exist, and the aforementioned input device 910 and the output device 912 can take other forms. The computing system 900 can further include a peripheral 914 and a sensor 916 for interacting with the environment of the computing system 900 in a manner described herein.

Software instructions in the form of computer readable program code to perform embodiments disclosed herein can be stored, in whole or in part, temporarily or permanently, on a non-transitory computer readable medium such as a CD, DVD, storage device, a diskette, a tape, flash memory, physical memory, or any other computer readable storage medium. Specifically, the software instructions can correspond to computer readable program code that when executed by a processor, is configured to perform operations disclosed herein. The computing system 900 can communicate with a server 917 via the network 913.

The memory 904 can include a circuit design tool 924. The circuit design tool 924 can include any of a variety of EDA applications. The circuit design tool 924 includes a circuit layout module 926 for generating a circuit layout of a circuit design 928 that is likewise saved in the memory 904, such as described herein. The circuit design tool 924 can further include a test-point flop allocation module 930 that is configured to determine test-point node compatibility and to divide the test test-point into test-point sharing groups based on the test-point node compatibility. The test-point flop allocation module 930 can also be configured to allocate the test-point flops to the test-point sharing groups, such that each of the test-point sharing groups is controlled by a single test-point flop in a testing mode. Additionally, the circuit design tool 924 can include a GUI 932 for facilitating generation of the circuit design 928, including providing user implementation of the circuit layout module 926 and the test-point flop allocation module 930. The circuit design 928 can thus be fabricated as an IC chip 934, such that the fabricated IC chip 934 can correspond directly to the circuit design 928.

Further, one or more elements of the aforementioned computing system 900 can be located at a remote location and connected to the other elements over the network 913. Additionally, some examples can be implemented on a distributed system having a plurality of nodes, where each portion of an embodiment can be located on a different node within the distributed system. In one example, the node corresponds to a distinct computing device. Alternatively, the node can correspond to a computer processor with associated physical memory. The node can alternatively correspond to a computer processor or micro-core of a computer processor with shared memory and/or resources.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A system comprising:
a non-transitory memory that stores machine-readable instructions and receives a circuit netlist associated with a circuit design, the circuit netlist comprising functional logic, test-point nodes interconnecting portions of the functional logic, and a plurality of test-point flops associated with scan-chains; and
a processing unit that accesses the memory and executes the machine-readable instructions, the machine-readable instructions comprising an electronic design automation (EDA) application, the EDA application comprising:
a test-point flop allocation module that is configured to evaluate the circuit netlist to determine compatibility of the test-point nodes in the circuit netlist, the test-point flop allocation module being further configured to allocate each of the test-point flops to one of a plurality of test-point sharing groups comprising a plurality of compatible test-point nodes; and
a circuit layout module configured to generate a circuit layout associated with the circuit design, the circuit layout comprising the functional logic and scan-chains comprising the test-point flops allocated to the test-point sharing groups in response to the circuit netlist.

2. The system of claim 1, wherein the test-point flop allocation module is configured to generate a compatibility matrix based on the circuit netlist, the compatibility matrix defining the compatibility of the test-point nodes in the circuit netlist based on shared nodes of the functional logic associated with a given pair of test-point nodes.

3. The system of claim 2, wherein the test-point flop allocation module is configured to implement a graph coloring algorithm based on the compatibility matrix to identify a quantity of compatible test-point nodes for each of the test-point nodes, wherein the graph coloring algorithm is configured to order the test-point nodes from minimum to maximum compatible test-point nodes and to assign an identifier to each the test-point nodes in the order based on relative compatibility of the test-point nodes, the identifier defining a given one of the test-point sharing groups.

4. The system of claim 3, wherein the graph coloring algorithm is configured to assign a first identifier to a first test-point node in the order and to assign the first identifier to a second test-point node further down the order in response to the graph coloring algorithm determining that the first and second test-point nodes are compatible.

5. The system of claim 4, wherein the graph coloring algorithm is configured to assign the first identifier to the second test-point node in response to the graph coloring algorithm determining that the first and second test-point nodes are compatible and in response to estimating that the first and second test-point nodes are proximal to each other in the circuit layout based on the circuit netlist.

6. The system of claim 3, wherein the test-point flop allocation module is configured to set a threshold of a quantity of the shared nodes of the functional logic to define compatibility between the given pair of test-point nodes based on the quantity of the shared nodes of the functional logic being less than the threshold, wherein the test-point flop allocation module is configured to increase the threshold in response to the graph coloring algorithm assigning a quantity of identifiers that is greater than a quantity of the test-point flops in the circuit netlist.

7. The system of claim 3, wherein the test-point flop allocation module is further configured to subdivide at least one of the test-point sharing groups into a plurality of smaller test-point sharing groups in response to the quantity of test-point flops defined by the circuit netlist being greater than the quantity of test-point sharing groups.

8. The system of claim 7, wherein, in response to the circuit layout module generating the circuit layout, the test-point flop allocation module is configured to subdivide the at least one of the test-point sharing groups into the smaller test-point sharing groups based on a relative proximity of the test-point nodes in a respective one of the test-point sharing groups on the circuit layout.

9. The system of claim 1, wherein, in response to the circuit layout module generating the circuit layout, the test-point flop allocation module is further configured to relocate each of the test-point flops proximal to a respective one of the test-point sharing groups in the circuit layout of the circuit design.

10. The system of claim 9, wherein the circuit layout module is further configured to provide interconnects between the relocated test-point flops in the circuit layout into the scan-chains.

11. A non-transitory computer readable medium comprising machine-readable instructions, the machine-readable instructions being executed to:
receive, at a circuit design tool executing on a computing platform, a circuit netlist associated with a circuit design, the circuit netlist comprising functional logic, test-point nodes interconnecting portions of the functional logic, and test-point flops associated with scan-chains;
evaluate the circuit netlist to determine compatibility of the test-point nodes in the circuit netlist via a test-point flop allocation module executing on the computing platform;
allocate each of the test-point flops to one of a plurality test-point sharing groups comprising a plurality of compatible test-point nodes via the test-point flop allocation module; and
generate a circuit layout associated with the circuit design, the circuit layout comprising the functional logic and scan-chains comprising the test-point flops allocated to the test-point sharing groups in response to the circuit netlist via a circuit layout module executing on the computing platform.

12. The medium of claim 11, wherein the test-point flop allocation module is configured to generate a compatibility matrix based on the circuit netlist, the compatibility matrix defining the compatibility of the test-point nodes in the circuit netlist based on shared nodes of the functional logic associated with a given pair of test-point nodes.

13. The medium of claim 12, wherein the test-point flop allocation module is configured to implement a graph coloring algorithm based on the compatibility matrix to identify a quantity of compatible test-point nodes for each of the test-point nodes, wherein the graph coloring algorithm is configured to order the test-point nodes from minimum to maximum compatible test-point nodes and to assign an identifier to each the test-point nodes in the order based on relative compatibility of the test-point nodes, the identifier defining a given one of the test-point sharing groups.

14. The medium of claim 13, wherein the graph coloring algorithm is configured to assign a first identifier to a first test-point node in the order and to assign the first identifier to a second test-point node further down the order in response to the graph coloring algorithm determining that the first and second test-point nodes are compatible and in response to estimating that the first and second test-point nodes are proximal to each other in the circuit layout based on the circuit netlist.

15. The medium of claim 13, wherein, in response to the circuit layout module generating the circuit layout, the test-point flop allocation module is configured to subdivide the at least one of the test-point sharing groups into the smaller test-point sharing groups based on a relative proximity of the test-point nodes in a respective one of the test-point sharing groups on the circuit layout.

16. A method for allocating test-point flops into scan-chains of a circuit design, the method comprising:
receiving, at a circuit design tool executing on a computing platform, a circuit netlist comprising functional logic, test-point nodes interconnecting portions of the functional logic, and test-point flops associated with scan-chains;
generating a compatibility matrix based on the circuit netlist via a test-point flop allocation module executing on the computing platform, the compatibility matrix defining the compatibility of the test-point nodes in the circuit netlist based on shared nodes of the functional logic associated with a given pair of test-point nodes;
implementing a graph coloring algorithm based on the compatibility matrix to identify a quantity of compatible test-point nodes for each of the test-point nodes via the test-point flop allocation module, wherein the graph coloring algorithm is configured to order the test-point nodes from minimum to maximum compatible test-point nodes and to assign an identifier to each the test-point nodes in the order based on relative compatibility of the test-point nodes, the identifier defining a given one of a plurality of test-point sharing groups;
allocating each of the test-point flops to one of the test-point sharing groups via the test-point flop allocation module, each of the test-point sharing groups comprising a plurality of compatible test-point nodes; and
generating a circuit layout associated with the circuit design, the circuit layout comprising the functional logic and scan-chains comprising the test-point flops allocated to the test-point sharing groups in response to the circuit netlist via a circuit layout module executing on the computing platform.

17. The method of claim 16, wherein implementing the graph coloring algorithm comprises assigning a first identifier to a first test-point node in the order and to assign the first identifier to a second test-point node further down the order in response to the graph coloring algorithm determining that the first and second test-point nodes are compatible and in response to estimating that the first and second test-point nodes are proximal to each other in the circuit layout based on the circuit netlist.

18. The method of claim 16, wherein implementing the graph coloring algorithm comprises:
setting a threshold of a quantity of the shared nodes of the functional logic to define compatibility between the given pair of test-point nodes based on the quantity of the shared nodes of the functional logic being less than the threshold; and
increasing the threshold in response to the graph coloring algorithm assigning a quantity of identifiers that is greater than a quantity of the test-point flops in the circuit netlist.

19. The method of claim 16, wherein allocating each of the test-point flops comprises subdividing at least one of the test-point sharing groups into a plurality of smaller test-point sharing groups in response to the quantity of test-point flops defined by the circuit netlist being greater than the quantity of test-point sharing groups.

20. The method of claim 16, further comprising relocating each of the test-point flops proximal to a respective one of the test-point sharing groups in the circuit layout of the circuit design via the circuit layout module.

* * * * *